(12) United States Patent
Dupont et al.

(10) Patent No.: US 12,740,217 B2
(45) Date of Patent: Sep. 15, 2026

(54) OPTOELECTRONIC DEVICE AND METHOD FOR MANUFACTURING SAME

(71) Applicant: Commissariat à l'Énergie Atomique et aux Énergies Alternatives, Paris (FR)

(72) Inventors: Florian Dupont, Grenoble Cedex (FR); François Templier, Grenoble Cedex (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 358 days.

(21) Appl. No.: 18/276,862

(22) PCT Filed: Feb. 11, 2022

(86) PCT No.: PCT/EP2022/053398
§ 371 (c)(1),
(2) Date: Aug. 10, 2023

(87) PCT Pub. No.: WO2022/175184
PCT Pub. Date: Aug. 25, 2022

(65) Prior Publication Data

US 2024/0128303 A1 Apr. 18, 2024

(30) Foreign Application Priority Data

Feb. 17, 2021 (FR) ....................................... 2101499

(51) Int. Cl.
*H10H 29/14* (2025.01)

(52) U.S. Cl.
CPC ................................ *H10H 29/142* (2025.01)

(58) Field of Classification Search
CPC ............ H10H 29/142; H10H 20/8512; H10H 20/01335; H10H 20/018; H10H 20/0361; H10H 20/8314; H10H 20/84; H10H 20/8513; H10H 29/14; H01L 25/167; H10W 90/00
See application file for complete search history.

(56) References Cited

U.S. PATENT DOCUMENTS

2011/0143144 A1* 6/2011 Ikegami .................. C30B 29/32 428/690
2017/0155020 A1 6/2017 Lin et al.
2018/0277608 A1* 9/2018 Lifka ........................ G01T 1/24
(Continued)

FOREIGN PATENT DOCUMENTS

CN 106876562 A 6/2017
CN 109979960 A 7/2019
(Continued)

OTHER PUBLICATIONS

International Preliminary Report on Patentability for International Application No. PCT/EP2022/053398 mailed Aug. 31, 2023.
(Continued)

*Primary Examiner* — Jonathan Han
(74) *Attorney, Agent, or Firm* — Wolf, Greenfield & Sacks, P.C.

(57) ABSTRACT

An optoelectronic device including a light-emitting diode covered with a photoluminescent conversion layer based on a perovskite material.

18 Claims, 11 Drawing Sheets

(56) References Cited

U.S. PATENT DOCUMENTS

| | | | | |
|---|---|---|---|---|
| 2019/0148602 | A1 | 5/2019 | Mu et al. | |
| 2020/0075814 | A1 | 3/2020 | Park et al. | |
| 2021/0057614 | A1* | 2/2021 | Liu | H10H 20/832 |
| 2021/0151648 | A1* | 5/2021 | Hin | H01L 21/4853 |
| 2021/0261860 | A1* | 8/2021 | Boehm | H10H 20/8512 |
| 2021/0408423 | A1* | 12/2021 | Kristal | H10K 85/30 |

FOREIGN PATENT DOCUMENTS

| | | | |
|---|---|---|---|
| CN | 110364611 | A | 10/2019 |
| CN | 111584534 | A | 8/2020 |
| EP | 3 255 120 | A1 | 12/2017 |
| WO | WO 2020/020925 | A1 | 1/2020 |

OTHER PUBLICATIONS

International Search Report and Written Opinion for International Application No. PCT/EP2022/053398, mailed May 27, 2022.

Hu et al., Vacuum-evaporated all-inorganic cesium lead bromine perovskites for high-performance light-emitting diodes. Journal of Materials Chemistry C. 2017;5(32):8144-9.

Wang et al., Pulsed laser deposition of CsPbBr3 films for application in perovskite solar cells. ACS Applied Energy Materials. Mar. 4, 2019;2(3):2305-12.

* cited by examiner

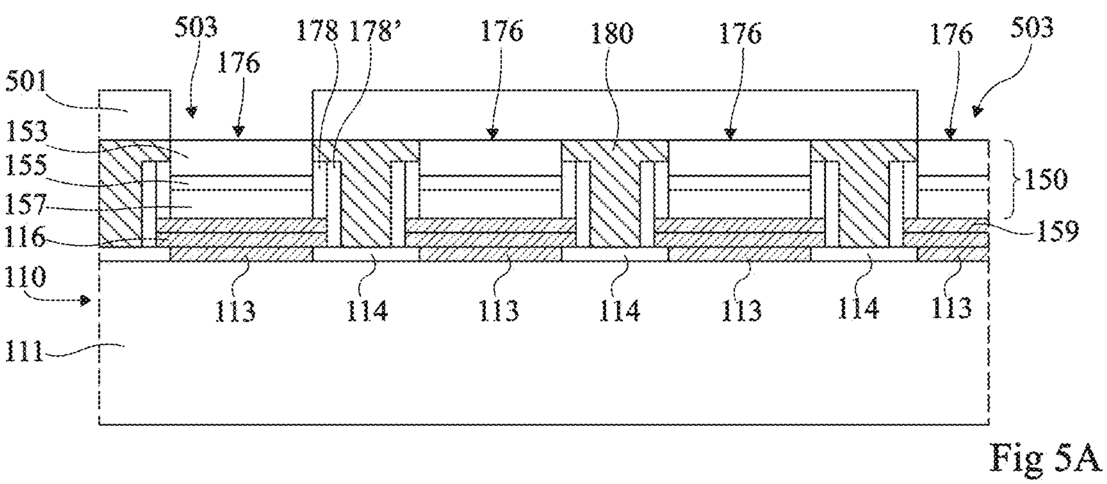
Fig 5A
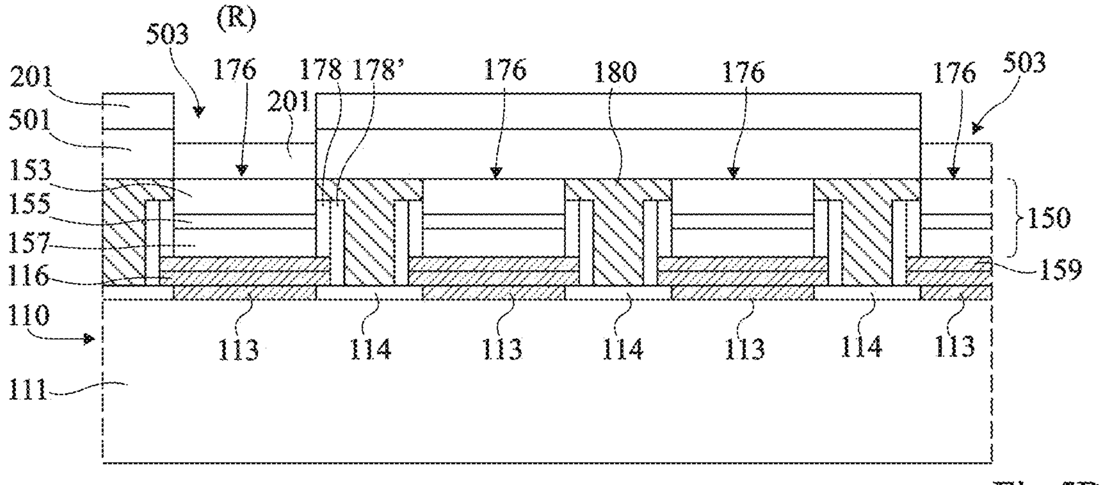
Fig 5B
(R)
201
176
178
178'
176
180
176
176
201
153
155
157
116
150
159
110
113
114
113
114
113
114
113
111
Fig 5C

OPTOELECTRONIC DEVICE AND METHOD FOR MANUFACTURING SAME

This Application is a national stage filing under 35 U.S.C. § 371 of International Patent Application Serial No. PCT/EP2022/053398, filed Feb. 11, 2022, which claims priority to the French patent application 2101499 filed on Feb. 17, 2021. The contents of these applications are incorporated herein by reference in their entireties.

TECHNICAL FIELD

The present disclosure relates to the domain of optoelectronic devices based on light-emitting diodes (LED).

BACKGROUND ART

It was already put forward, for example in the patent application WO2017/194845 or in the patent application WO2019/092357, an emissive display device comprising an array of LED and a control circuit that makes it possible to individually monitor the LEDs to display images.

In these devices, the LEDs are all substantially identical, and substantially emit at the same wavelength. Thus, the array of LEDs only makes it possible to display monochromatic pictures.

To get a display device for coloured pictures, photoluminescent conversion elements may be arranged in front of some of the LEDs of the array. The conversion element is configured to absorb photons at the emission wavelength of the LEDs and to re-emit photons at another wavelength. For example, in the case where the LEDs are configured to mainly emit blue light, it is required to cover first LEDs with a conversion element configured to convert blue light into red light, to cover second LEDs with a conversion element configured to convert blue light into green light, and to leave third LEDs non-covered by any conversion element. Thus, you get a device to display pictures in red-green-blue colours (RGB).

To convert the light emitted by a LED, it has been put forward light-emitting elements based on quantum dots embedded in an organic layer, conversion elements based on phosphorescent materials, or conversion elements based on multiple quantum dots made of semiconductor materials of type III-V.

However, the integration of such conversion elements into a LED-based emissive display device poses various problems.

SUMMARY OF INVENTION

An embodiment comprises an optoelectronic device comprising a light-emitting diode covered with a photoluminescent conversion layer based on a perovskite material.

According to an embodiment, the photoluminescent conversion layer is based on an inorganic perovskite material.

According to an embodiment, the photoluminescent conversion layer is based on an inorganic perovskite halogen material.

According to an embodiment, the light-emitting diode is an inorganic light-emitting diode.

According to an embodiment, the photoluminescent conversion layer is in contact with a semiconductor zone of the light-emitting diode.

According to an embodiment, the semiconductor zone is based on a semiconductor III-V material, preferably based on gallium nitride.

According to an embodiment, the device comprises at least a first light-emitting diode covered with a first layer based on a first perovskite material and a second light-emitting diode covered with a second layer based on a second perovskite material, and a third light-emitting diode not covered with the first and second layers.

According to an embodiment, the first light-emitting diode is not covered with the second layer based on a second perovskite material and the second light-emitting diode is not covered with the first layer based on a first perovskite material.

According to an embodiment, the first light-emitting diode is not covered with the second layer based on a second perovskite material and the second light-emitting diode is covered with the first layer based on a first perovskite material and with the second layer based on a second perovskite material.

According to an embodiment, the first, second and third light-emitting diodes are integrated in a same monolithic display device.

According to an embodiment, the device also comprises, adjoined to the light-emitting diode, an integrated circuit to monitor the light-emitting diode.

Another embodiment comprises a process to manufacture an optoelectronic device comprising a light-emitting diode, wherein the process comprises a step of deposition of a photoluminescent conversion layer based on a perovskite material onto the light-emitting diode.

According to an embodiment, the photoluminescent conversion layer is deposited by pulsed laser deposition.

According to an embodiment, the photoluminescent conversion layer is deposited onto and in contact with a semiconductor zone of the light-emitting diode.

According to an embodiment, the photoluminescent conversion layer is first continuously deposited all over the surface of the device, and then locally removed by photolithography and etching.

According to an embodiment, the photoluminescent conversion layer is locally deposited through a selective growth substrate.

According to an embodiment, the photoluminescent conversion layer is locally deposited and self-aligned by selective growth on the light-emitting diode.

According to an embodiment, the photoluminescent conversion layer is deposited onto and through a sacrificial layer, wherein the process further comprises, after deposition of the photoluminescent conversion layer, a step of removing the sacrificial layer.

BRIEF DESCRIPTION OF DRAWINGS

The foregoing features and advantages, as well as others, will be described in detail in the following description of specific embodiments given by way of illustration and not limitation with reference to the accompanying drawings, in which:

FIGS. 5A to 5F are cross-section views that illustrate successive steps of another variant of a process to manufacture an emissive LED display device according to an embodiment.

DESCRIPTION OF EMBODIMENTS

Figures 1A, 1B, 1C:
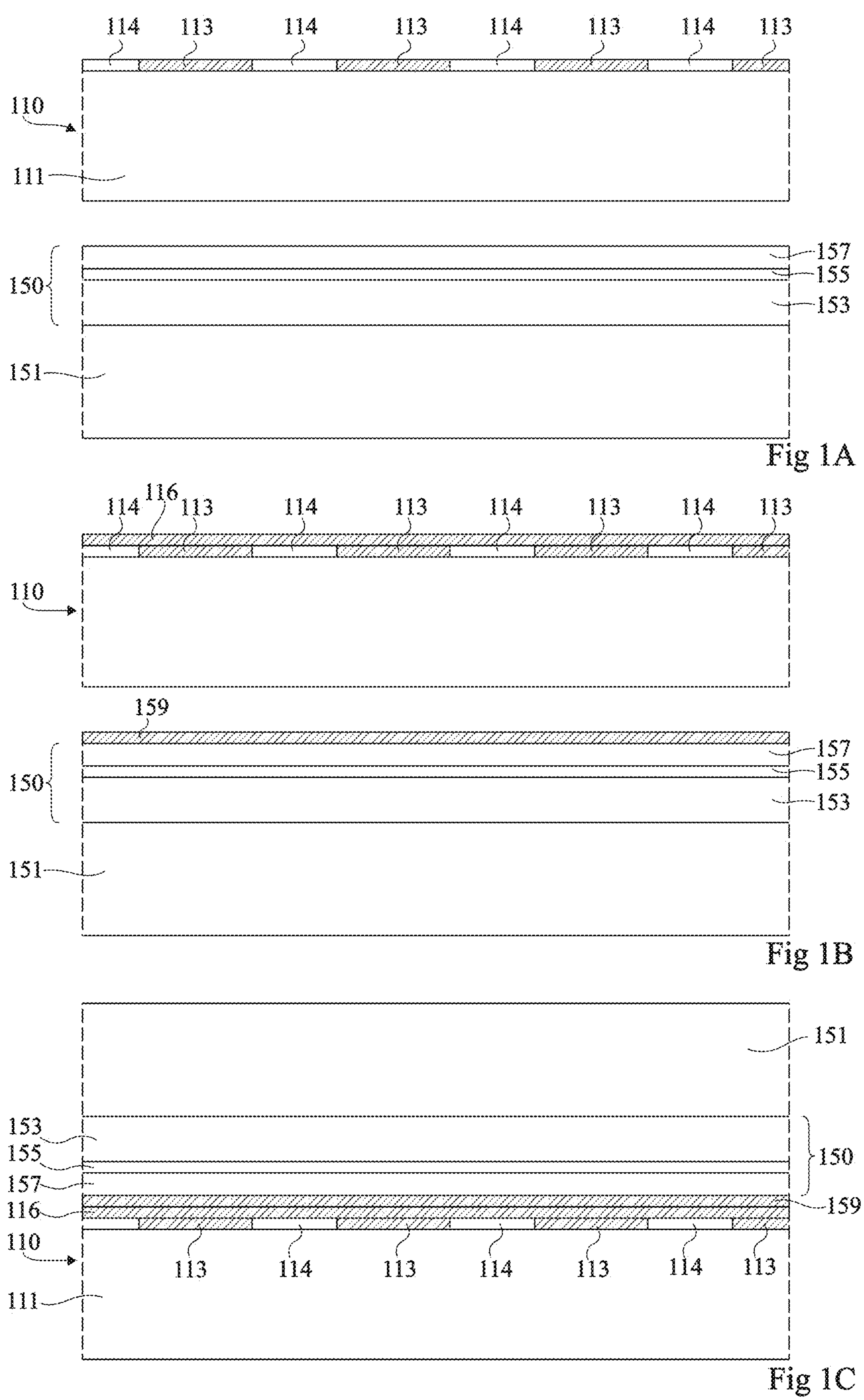
FIGS. 1A and 1O are cross-section views that illustrate successive steps of an example of a process to manufacture an emissive LED display device according to an embodiment.

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the manufacture of an integrated circuit to control semiconductor diodes has not been detailed, wherein the described embodiments are compatible with the usual structures and manufacturing processes of such control circuits. In addition, the composition and the layout of the various layers of an active pile of semiconductor diodes were not detailed, since the described embodiments are compatible with the usual active piles of semiconductor diodes, for example gallium nitride semiconductor diodes.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms “front”, “back”, “top”, “bottom”, “left”, “right”, etc., or to relative positional qualifiers, such as the terms “above”, “below”, “higher”, “lower”, etc., or to qualifiers of orientation, such as “horizontal”, “vertical”, etc., reference is made to the orientation shown in the figures.

Unless specified otherwise, the expressions “around”, “approximately”, “substantially” and “in the order of” signify within 10%, and preferably within 5%.

An aspect of an embodiment comprises the use of an element based on a perovskite-structured material as a conversion element for the light emitted by a LED, preferably by an inorganic LED, for example a LED based on type III-V semiconductor materials.

The conversion element can be a part of a material perovskite-structured layer against an emission side of the LED.

An advantage is that perovskite-structured materials, hereafter called perovskite materials, have a high quantic efficiency that can reach up to 100%.

Another advantage is that perovskite materials have a high absorption coefficient, for example circa $1*10^5$ to $2*10^5$ for methylammonium lead triiodide ($MAPbI_3$) and for a 450 nm wavelength. Thus, the light conversion function can be efficiently provided by a relatively thin layer, for example a layer less than 1 μm thick, for example ca. 250 nm thick.

Another advantage is that perovskite material layers can be applied at relatively low temperatures, for example less than 400° C., which makes it possible to deposit them on a CMOS-type integrated circuit (Complementary Metal Oxide Semiconductor).

Another advantage is that perovskite materials show a great tolerance to crystal structure defects. Thus, the function of light conversion can be efficiently provided by a relatively thin polycrystalline layer.

Thanks to the low thicknesses required for the light conversion, perovskite material layers can be easily etched, which allows conversion elements with very small side dimensions.

Hence, perovskite materials are particularly advantageous to manufacture light conversion elements in small-dimension pixels, for example to manufacture colour picture display screens with an inter-pixel pitch, also called pixel pitch or pixel repetition pitch, less than 100 μm, for example less than 20 μm. Preferably, in the described embodiments, the pixel pitch is less than 5 μm, for example less than 2 μm, for example less than 1 μm.

The perovskite materials in use are preferably inorganic materials with the advantage of greater stability in time.

As an example, it is possible to use a perovskite material based on cesium, lead and bromine, for example $CsPbI_2Br$ to emit red light, or $CsPbBr_3$ to emit green light. As a variant, it is possible to use a $MAPbI_3$-type perovskite material. More generally, other perovskite materials can be selected according to the requested conversion properties.

As a rule, preferably used perovskite materials are perovskite halogen materials, which means of type $ABX_3$, where:

A is an inorganic element (it is called inorganic perovskite halogen material), for example cesium (Cs), lead (Pb), phosphorus (K) or lithium (Li), or is an organic element (it is called organic perovskite halogen material), for example formamidinium, also called FA, of formula $CN_2H_{5+}$, or methylammonium, also called MA, of formula $CH_3NH_{3+}$, or a combination of these elements, B is lead (Pb), tin (Sn) or germanium (Ge), or a combination of these elements, and X is a halogen element, for example bromine (Br), chloride (Cl), iodine (I) or a combination of halogens.

Non-limitative examples of integration of conversion elements based on perovskite materials in a LED-based display device are described below.

Figure 1D:
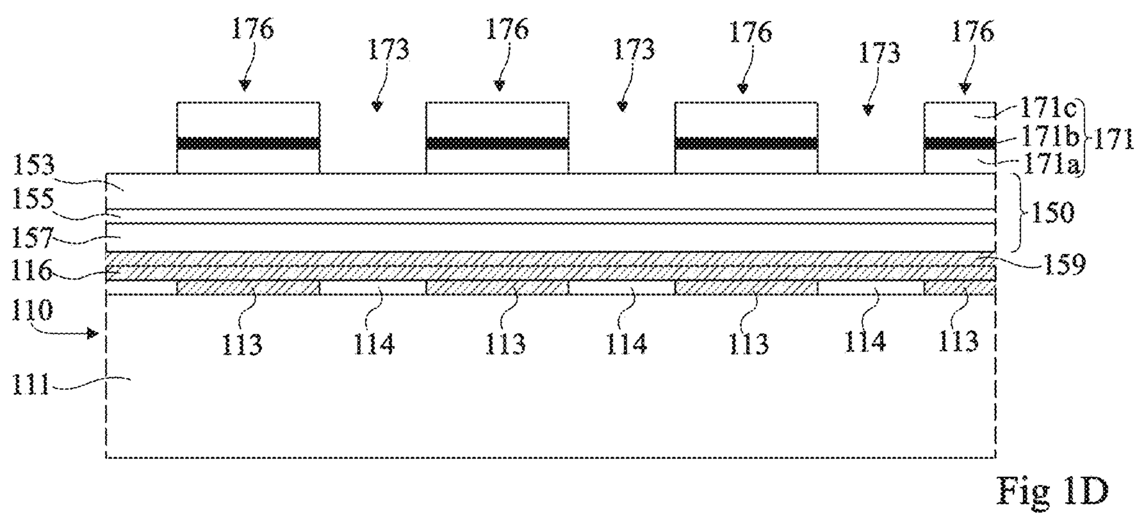
Figure 1E:
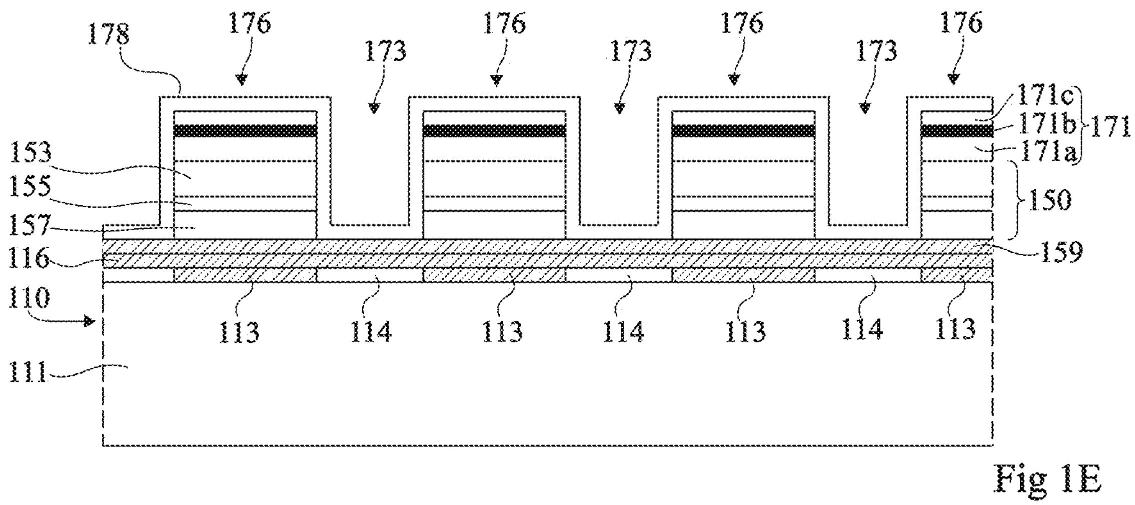
Figure 1F:
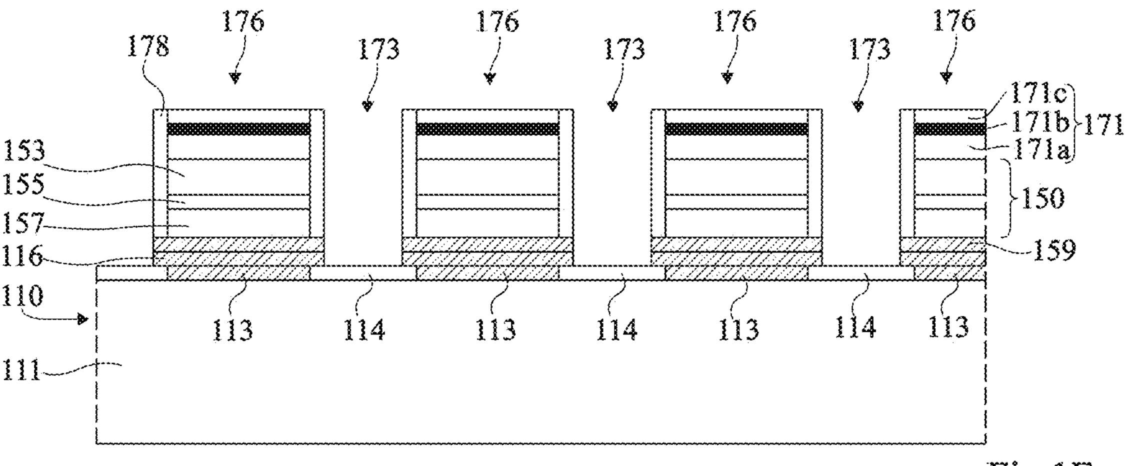
Figure 1G:
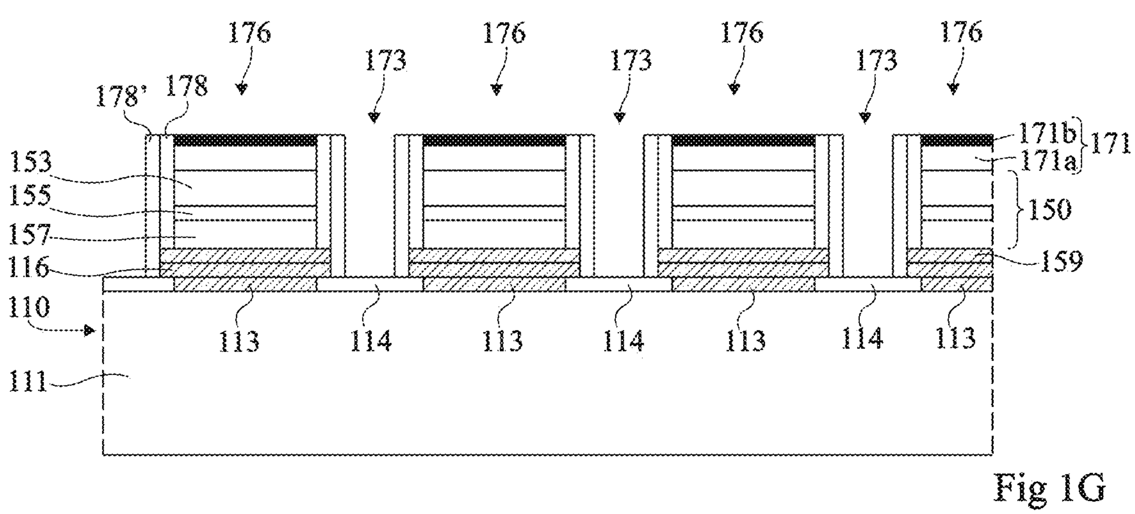
Figure 1H:
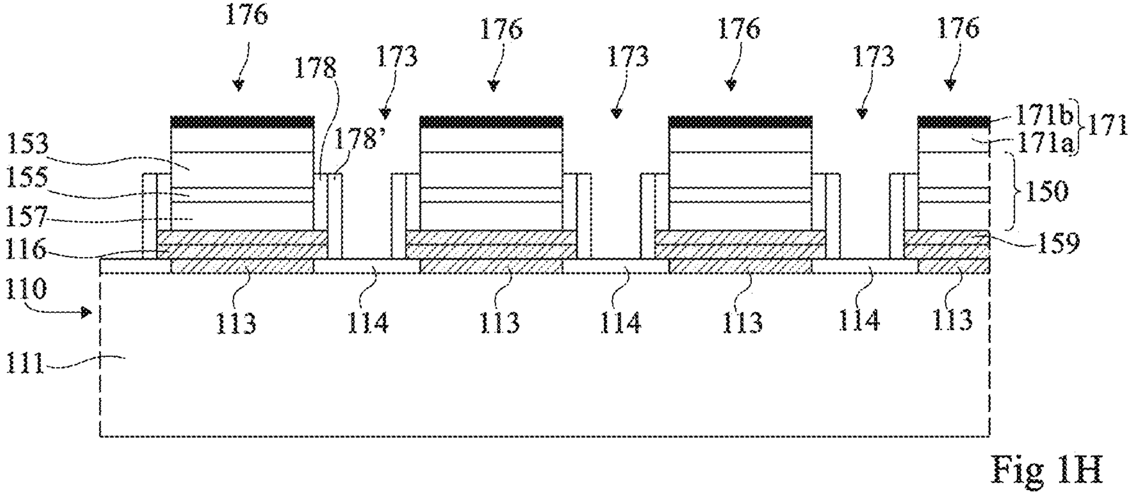
Figure 1I:
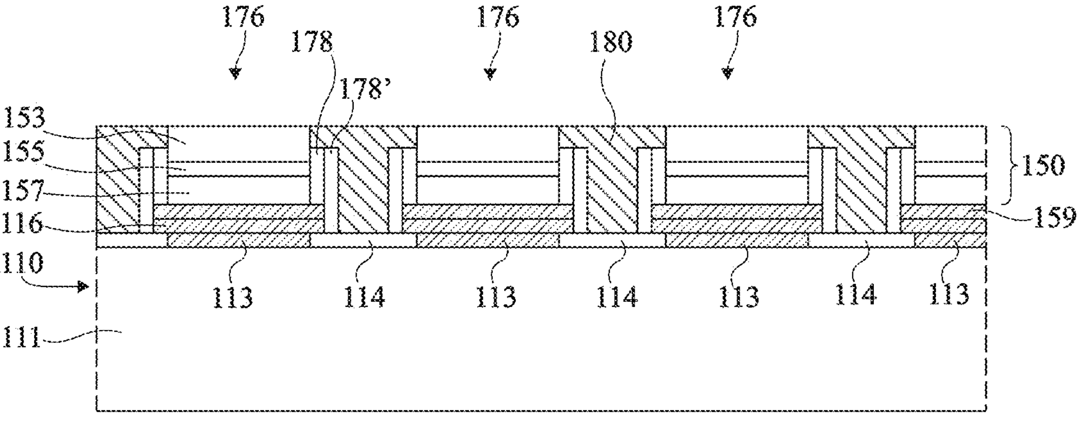
Figure 1J:
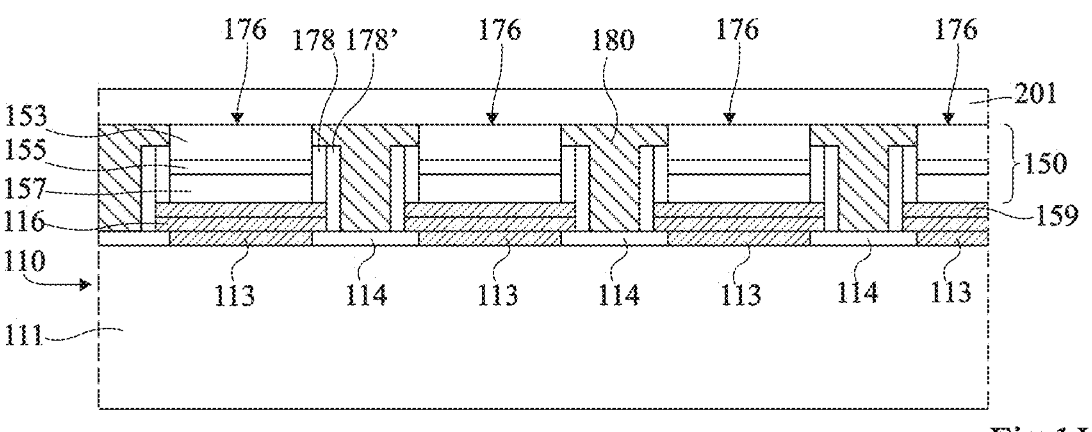
Figure 1K:
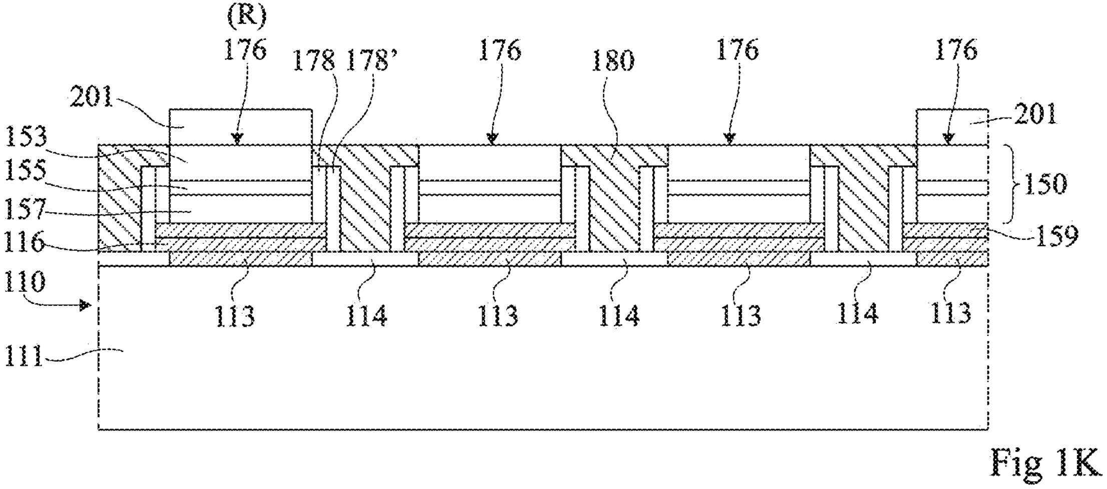
Figure 1L:
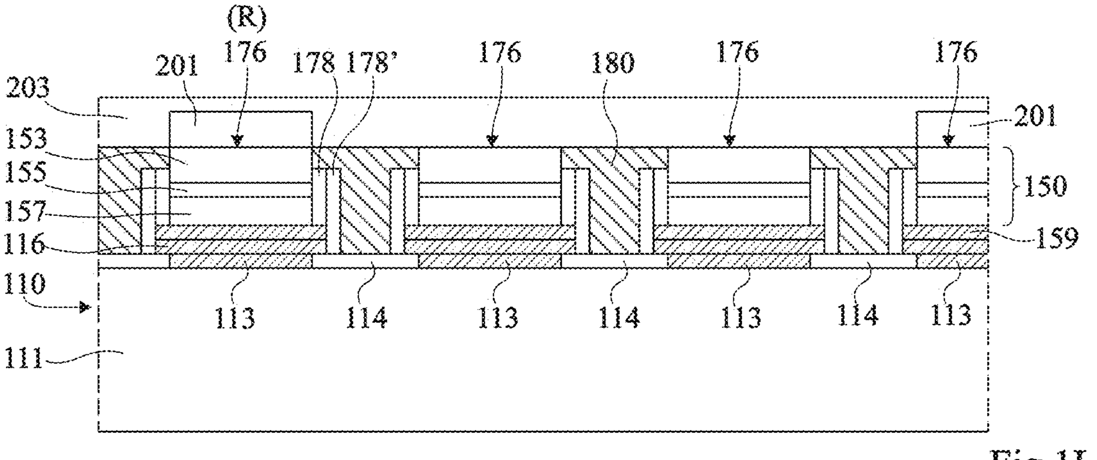
Figure 1M:
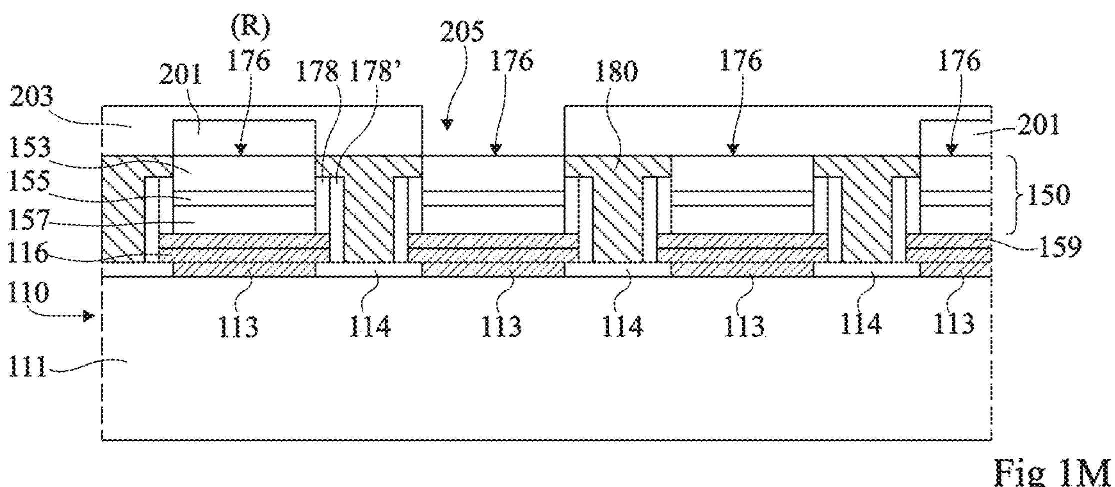
Figure 1N:
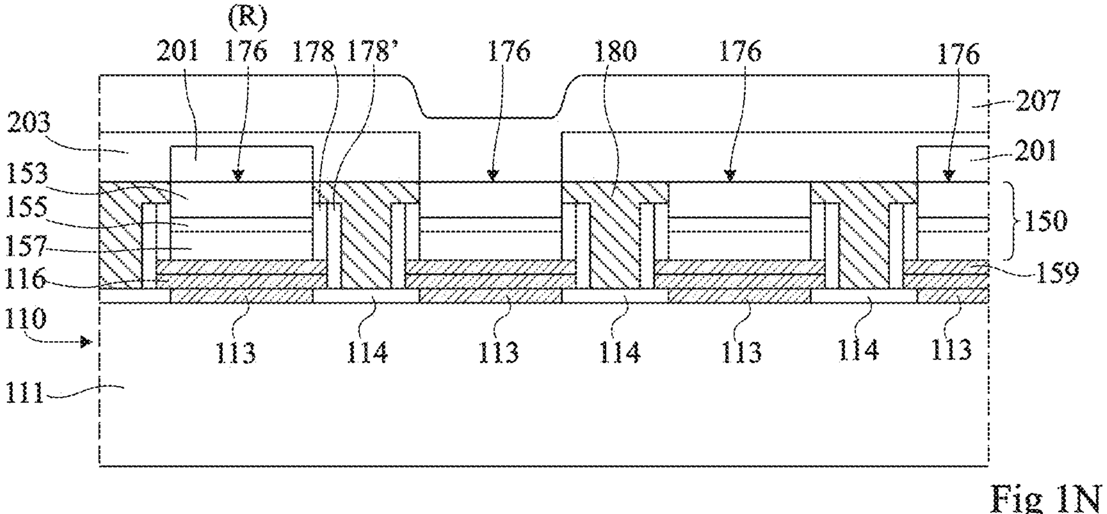
Figure 1O:
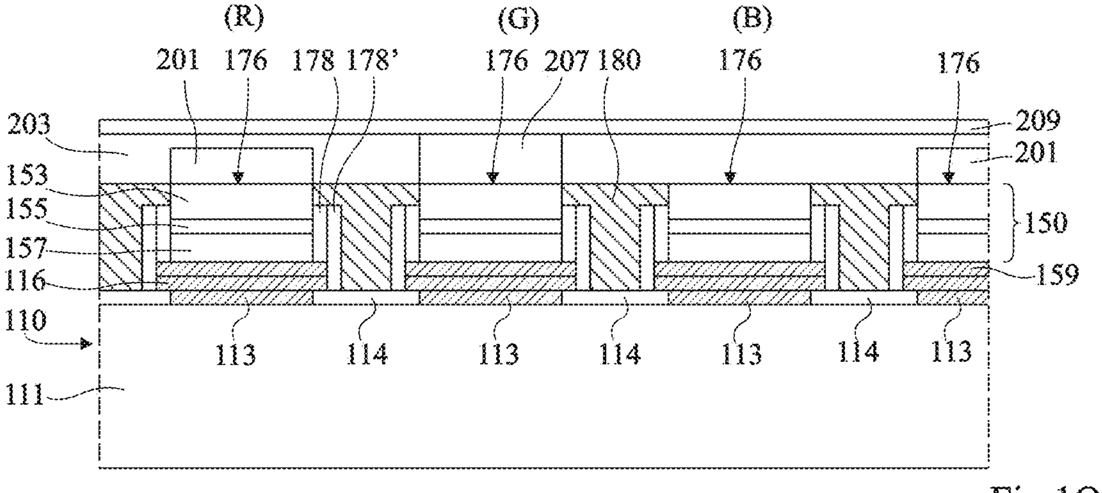

FIGS. 1A and 1O are cross-section views that illustrate successive steps of an example of a process to manufacture a LED optoelectronic device according to an embodiment.

FIG. 1A schematically illustrates an integrated control circuit 110, previously manufactured in and on a semiconductor substrate 111, for example a silicon substrate. In this example, the command circuit 110 comprises, on the upper ide, for each LED of the device, a metal connection pad 113 designed for connection to one of the electrodes (anode or cathode) of the LED in order to command a current through the LED and/or apply a voltage at the terminals of the LED. The control circuit comprises, for example, for each LED connected to the metal pad 113 dedicated to the LED, an elementary control cell comprising at least one transistor that makes it possible to monitor the current through the LED and/or a voltage at the terminals of the LED. The control circuit 110 is, for example, manufactured as a CMOS technology. The metal pads 113 can be laterally surrounded with an isolating material 114, for example silicon oxide, so that the control circuit 110 has an upper surface substantially plane comprising an alternating pattern (checkerboard) of metal zones 113 and isolating zones 114. The contact on the electrodes of the LED (cathodes or anodes) non-connected to the pads 113 can be collective, for example in a peripheral zone of the control circuit 110, through at least one connection pad (not displayed in the figure) of the control circuit 110.

FIG. 1A also schematically illustrates an active pile of LEDs 150, for example a gallium nitride LED, positioned on the upper side of a support substrate 151. The support substrate 151 is, for example, based on silicon, sapphire, corundum, or any other material on which an active pile of LEDs can be deposited. In the illustrated example, the active pile comprises, up from the upper surface of the substrate 151, a layer 153 based on a N-type doped semiconductor material, for example a N-type gallium nitride layer, an emissive layer 155, and a layer 157 based on a P-type doped semiconductor material, for example a P-type doped gallium nitride layer. The emissive layer 155 is, for example, based on a pile of at least one emissive layer that each form a quantum dot, for example based on GaN, InN, InGaN, AlGaN, AlN, AlInGaN, GaP, AlGaP, AlInGaP, or on a combination of at least one of these materials. As a variant, the emissive layer 155 can be an intrinsic gallium nitride layer, which means not purposely doped, for example at a concentration of residual giving atoms between $10^{15}$ and $10^{18}$ atoms/cm$^3$, for example ca. $10^{17}$ atoms/cm$^3$. In this example, the lower side of the emissive layer 155 is in contact with the upper side of the layer 153 and the upper side of the emissive layer 155 is in contact with the lower side of the layer 157. In practice, according to the nature of the substrate 151, a pile of at least one buffer layer (not illustrated) can be an interface between the support substrate 151 and the gallium nitride layer 153. The active pile 150 is, for example, epitaxied onto the support substrate 151.

FIG. 1B illustrates a deposition step on the upper side of the control circuit 110 of a metal layer 116. In the illustrated example, the metal layer 116 covers substantially the whole upper surface of the control circuit 110. In particular, the metal layer 116 is in contact with the metal connection pads 113 of the control circuit 110.

FIG. 1B illustrates a deposition step on the upper side of the active pile of LEDs 150 of a metal layer 159. In the illustrated example, the metal layer 159 is laid on and in contact with the upper side of the P-type semiconductor layer 157. The metal layer 159 covers, for example, substantially the whole upper surface of the active pile 150.

FIG. 1C illustrates a step, wherein the active pile of LEDs 150 is deposited on the upper side of the control circuit 110. To do so, it is possible to turn the support substrate 151 and the active pile 150 upside down and to deposit it onto the control circuit 110 in order to bring the upper side (according to FIG. 1B) of the metal layer 159 in contact with the metal layer 116. During this step, the active pile 150 is bonded to the control circuit 110. As an example, the fixing of an active pile 150 on the control circuit 110 is possible by molecular gluing between the two surfaces in contact. As a variant, the fixing of the two surfaces is possible by thermocompression, eutectic bonding or any suitable bonding process.

Once the active pile of LEDs 150 bonded onto the upper side of the control circuit 110, the support substrate 151 of the active pile of LEDs is removed, in order to uncover the upper side of the N-type semiconductor layer 153. The substrate 151 is removed, for example, by grinding and/or etching from the side opposite to the active pile 150. As a variant, in the case of a transparent substrate 151, for example in the case of a sapphire or corundum substrate, the substrate 151 can be removed from the active pile 150 thanks to a laser through the substrate 151 from the side opposite to the active pile 150 (laser lift-off process). More generally, any other process suitable to remove the substrate 151 can be used. After removal of the substrate 151, an additional step of etching is possible to remove possible buffer layers remaining on the upper side of the semiconductor layer 153. Furthermore, a part of the thickness of the semiconductor layer 153 can be removed, for example by etching. After this step, the active pile 150 covers substantially the whole surface of the control circuit 110 without any discontinuity. As an example, the thickness of the active pile 150 after removal of the support substrate 151 is between 0.5 and 10 μm.

After the removal of the substrate 151, the FIG. 1D illustrates a step of deposit of a hardmask 171 on the upper side (according to FIG. 1D) of the active pile of LEDs 150. In this example, the hardmask 171 is made of a pile comprising, from the upper side of the N-type semiconductor layer 153, a first silicon oxide layer 171*a*, an intermediate etch stop layer 171*b* and a second silicon oxide layer 171*c*. The intermediate layer 171*b* is based on a material relatively difficult to etch relatively to silicon oxide, for example aluminum, alumina or a nitride. For example, the intermediate layer 171*b* is between 10 and 500 nm thick, for example ca. 100 nm thick.

In addition, FIG. 1D illustrates a step of manufacture of openings or crossing grooves 173 thought the hardmask 171, for example by photolithography and then etching. The grooves 173 extend from the upper side of the hardmask 171 to the upper side of the active pile of LEDs 150. The grooves 173 delineate, when viewed from above, the future individual LEDs 176 of the display device.

FIG. 1E illustrates a step of extension of the previously manufactured grooves 173 of the hardmask 171 through the active pile of LEDs 150. For example, the grooves 173 are extended vertically by etching through the layers 153, 155 and 157 of the pile of LEDs 150, wherein the etching is stopped on the upper side of the metal layer 159. During this etching step, the upper silicon oxide layer 171*c* of the hardmask 171 can be partly or totally consumed. On the other hand, the layers 171*b* and 171*a* are retained. Extending the grooves 173 though the active pile 150 leads to the delineation of a plurality of LEDs 176 in the active pile 150. Each LED 176 is some kind of islet or mesa inside the pile 150 and is laterally surrounded by a groove 173. Thus, each LED 176 comprises a vertical pile comprising, from the upper surface of the metal layer 159, a part of the P-type semiconductor layer 157 that is the anode of the LED, a part of the emissive layer 155 and a part of the N-type semiconductor layer 153 that is the cathode of the LED. The grooves 173 can be aligned relatively to previously manufactured benchmarks on the control circuit 110. More specifically, at the step of FIG. 1D, after deposition of the hardmask 171 but before manufacturing of the grooves 173, it is possible to clear previously manufactured benchmarks on the substrate 111 by etching of the hardmask 171 and of the active pile 150 in peripheral zones of the assembly, wherein these benchmarks are then used as alignment benchmarks for positioning the photolithographic mask designed to manufacture the grooves 173. In the illustrated example, each LED 176 is located in front of a single metal pad 113 of the control circuit 110 as per a vertical projection. In this example, the grooves 173 are located in front of isolating zones 114 of the upper side of the control circuit 110, as per a vertical projection.

FIG. 1E further illustrates a step of deposition of an isolating layer 178, for example based on silicon oxide, on the side walls and at the bottom of the grooves 173. In the illustrated example, the layer 178 is further deposited on the upper surface of the parts of the hardmask 171 coating the LEDs 176. The layer 178 is, for example, deposited over the whole upper surface of the device by a process of conformal deposition, for example by successive atomic layer depositions (ALD). For example, the thickness of the isolating layer 178 is between 10 nm and 1 μm.

FIG. 1F illustrates a step of removal of the isolating layer 178 at the bottom of the grooves 173. During this step, the layer 178 is retained on the side walls of the grooves 173. To do so, the layer 178 is, for example, etched by vertical anisotropic etching, which further leads to the removal of the layer 178 from the upper side of the parts of the hardmask 171 coating the LEDs 176.

FIG. 1F also illustrates a step of removal, for example by etching, of parts of the metal layers 159 and 116 located at the bottom of the grooves 173, in order to extend the grooves 173 until the isolating zones 114 of the upper side of the control circuit 110. After this step, the anodes (zones 157) of the various LEDs 176 are electrically isolated from each other by the grooves 173, and each LED 176 has its own anode connected to the underlying metal pad 113 thanks to parts of metal layers 159 and 116 remaining between the LED and the pad 113. This allows an individual monitoring of the LEDs by the control circuit 110.

FIG. 1G illustrates a later step of deposition, onto the lateral walls of the grooves 173, of a second isolating layer 178', for example based on silicon oxide. The layer 178' is, for example, deposited over the whole upper surface of the assembly by a process of conformal deposition, then removed only from the upper side of the LEDs 176 and at the bottom of the grooves 173, for example by vertical anisotropic etching.

FIG. 1H illustrates a later step of removal of the isolating layers 178 and 178' from an upper part of the sides of the LEDs 176. More specifically, during this step, the isolating layers 178 and 178' are removed from all or a part of the sides of the zone of the cathode 153 of each LED 176 in order to give access to the sides of the cathode zones 153 of the LED. For example, the isolating layers 178 and 178' are removes from substantially all the height of the sides of the cathode zones 153 of the LEDs 176. On the other hand, the layers 178 and 178' are retained on the sides of a lower part of each LED 176, in particular on the whole height of the emissive zone 155 and of the anode zone 157 of each LED 176. In addition, the layer 178' remains on the sides of the metal layers 116 and 159. As an example, the removal of the layers 178 and 178' from an upper part of the sides of the LEDs 176 is made by vertical anisotropic etching. The etching process is preferably selected in order to selectively etch the silicon oxide relatively to the material of the intermediate layer 171*b* of the hardmask 171. As an example, the upper layer of silicon oxide 171*c* of the hardmask 171 is entirely consumed at this step, while the layer 171*b* remains and protects the lower part 171*a* of the hardmask 171. The described embodiments do not restrict to this specific case. As an example, the hardmark 171 can be based on silicon oxide only, under condition that its thickness is enough to protect the upper side of the LEDs 176 during vertical anisotropic etching of FIG. 1H.

FIG. 1I illustrates a later step of deposition of a metal layer 180 onto the side walls and the bottom of the grooves 173. In the illustrated example, the metal layer 180 fills completely the grooves 173. As an example, the metal layer 180 is manufactured by a damascene-type process, which comprises a step of deposition of a metal layer onto the whole upper surface of the assembly thick enough to fill the grooves 173, followed by a step of chemical mechanical polishing of the upper side of the assembly to planarize the upper side of the device and remove the parts of the metal layer coating the LEDs 176. In this example, the etch stop layer 171*b* and the lower silicon oxide layer 171*a* of the hardmask 171 are furthermore removed during the step of chemical mechanical polishing in order to expose the upper side of the cathode zone 153 of each LED. As a (not illustrated) variant, the lower silicon oxide layer 171*a* or a part of the thickness of the layer 171*a* can be retained and be used as a passivation coating of the upper side of the cathode zones 153 of the LEDs 176. The metal layer 180 is, for example, based on a lower layer of hangs, which comprises, for example, a pile aluminum/titanium/titanium nitride/copper with a thickness between 10 and 100 nm, for example ca. 50 nm thick, and an upper filling layer, for example based on copper, manufactured by electrochemical deposition. The metal layer 180 is in contact with the sides of the cathode zone 153 of each LED 176 of the display device substantially all along the peripheral part of the LED. On the other hand, the metal layer 180 is isolated from the anode zones 157 and the emissive zones 155 of the LEDs by the isolating layers 178 and 178'. In this example, the metal layer 180 constituted, viewed from below, a continuous conductive grid that connects the cathode zones 153 of all the LEDs of the device. The metal layer 180 is, for example, connected to the control circuit 110 in a peripheral zone of the display device.

The device resulting from the steps of FIGS. 1A to 1I is a monochromatic display device. Indeed, the LEDs 176 are all substantially identical, and substantially emit at the same wavelength. As an example, the LEDs 176 mainly emit blue light.

FIGS. 1J to 1O illustrate the later steps that make it possible to manufacture a display device for coloured pictures from the device of FIG. 1I.

FIG. 1J illustrates a step of deposition of a light conversion layer 201 based on a perovskite material onto the upper surface of the device of FIG. 1I. The layer 201 is suitable to absorb photons at the emission wavelength of the LEDs 176 and to re-emit photons at another wavelength. For example, the layer 201 is suitable to convert blue light into red light.

The thickness of the layer 201 is, for example, not more than 1 μm, for example not more than 500 nm, for example not more than 300 nm, for example between 100 and 250 nm. The layer 201 can be monocrystalline, polycrystalline or amorphous. The crystallographic structure of the layer 201 is homogenous all through its thickness. In other words, these are no quantum dots integrated in a matrix layer.

The layer 201 is, for example, deposited by PLD-process (pulsed laser deposition) over the whole upper surface of the structure of FIG. 1I. PLD deposition is a process of physical vapor deposition consisting of pulverizing a target made of the perovskite material thanks to a pulsed laser in order to transfer the material into a plasma, and then onto the target substrate thanks to the plasma phase. An advantage of PLD deposition is to deposit complex materials, such as perovskite materials, with good crystal quality, at relatively low temperature, for example less than 400° C., with damaging the destination substrate. As a variant, the layer 201 can be deposited by any other suitable deposition process, for example a sol-gel process, or any other physical deposition process in vapor phase (evaporation or co-evaporation).

At this stage, the conversion layer 201 extends, for example, continuously and with a substantially homogeneous thickness over the whole surface of the display device.

In the illustrated example, the conversion layer 201 comes directly in contact, at its lower side, with the upper side of the semiconductor cathode zones 153 of the LEDs 176, which defines the emission side of the LEDs. The advantageously makes it possible to maximize the coupling between the LEDs and the conversion layer. Furthermore, in the case the semiconductor zone 153 is based on gallium nitride, the perovskite material deposit directly in contact with the semiconductor zone 153 makes it possible to get a conversion layer 201 with a monocrystalline structure aligned with the crystalline structure of the gallium nitride in front of the corresponding LEDs 176. This gives the conversion element 201 greater stability in time. The described embodiments do not restrict to this specific case. As a variant, at least one dielectric layer can be used as an interface between the upper side of the LEDs and the layer 201.

FIG. 1K illustrates a later stage of the step of 1J, where parts of the conversion layer 201 are removed, for example by dry etching, in front of some parts of the display device. In particular, during this stage, the conversion layer 201 remains over some LEDs 176 and is removed from the other LEDs 176. To do so, an etching mask, not illustrated, for example created by photolithography, can be deposited onto the upper side of the conversion layer 201, wherein this mask can be open in front of parts of the conversion layer 201 to remove. The mask may be removed after etching. The LEDs 176 that remain coated with parts of the conversion layer 201 after this step define first pixels (R) suitable to emit light at a first wavelength, for example red light.

FIG. 1L illustrates a step of deposition of a passivation layer 203 based on a dielectric material, for example silicon oxide or silicon nitride, onto the upper surface of the structure resulting from the step of FIG. 1K. In this example, the layer 203 extends thicker than the conversion layer 201. Thus, the parts of the conversion layer 201 that remain in front of the LEDs of the pixels (R) of the device remain completely coated by the layer 203. The layer 203 extend continuously all over the surface of the display device, and has, in this example, a substantially plane upper surface.

FIG. 1M illustrates a step of localized removal of the layer 203 in front of some LEDs 176 that are not coated with parts of the layer 201, in order to create openings 205 in front of said LEDs. The layer 203, for example, is removed by dry etching using an etching mask. During this step, the layer 203 remains in front of the LEDs 176 coated with parts of the layer 201. In addition, the layer 203 remains in front of other LEDs 176 not coated with parts of the layer 201. In the illustrated example, the openings 205 in the layer 203 cross through all the thickness of the layer 203. The openings 205 reach, for example, the upper side of the semiconductor zone 153 of the LEDs 176.

FIG. 1N illustrates a step of deposition of a light conversion layer 207 based on a perovskite material distinct from the material of the layer 201 onto the upper side of the device of FIG. 1M. The layer 207 is suitable to absorb photons at the emission wavelength of the LEDs 176 and to re-emit photons at another wavelength that is distinct from the re-emission wavelength of the layer 201. For example, the layer 207 is suitable to convert blue light into green light.

The thickness of the layer 207 is, for example, not more than 1 μm, for example not more than 500 nm, for example not more than 300 nm, for example between 100 and 250 nm. The layer 207 can be monocrystalline, polycrystalline or amorphous. The crystallographic structure of the layer 207 is homogenous all through its thickness. In other words, these are no quantum dots integrated in a matrix layer.

The layer 207 is, for example, deposited by PLD-process or by any other suitable deposition method, for example sol-gel or physical vapor phase deposition on the upper side of the structure of FIG. 1M.

In this example, the conversion layer 207 extend continuously all over the surface of the display device. In particular, the conversion layer extends into the openings 205 previously manufactured through the layer 203. In the illustrated example, the conversion layer 207 comes directly in contact, at its lower side, with the upper side of the semiconductor cathode zones 153 of the LEDs 176 located in front of the openings 205. The described embodiments do not restrict to this specific case. As a variant, at least one dielectric layer can be used as an interface between the upper side of the LEDs and the layer 207.

FIG. 1O illustrates a stage where parts of the conversion layer 207 are removed in front of some parts of the display device. In particular, during this stage, the conversion layer 201 remains only over some LEDs 176, in front of which openings 205 were previously manufactured through the layer 203. The LEDs 176 that remain coated with parts of the conversion layer 207 after this step define second pixels (G) suitable to emit light at a second wavelength, for example green light.

The localized removal of the conversion layer 207 can be made by dry etching, thanks to a non-illustrated etching mask.

As a variant, a step of chemical mechanical polishing (CMP) can be implemented to remove the conversion layer 207 everywhere, except in the openings 205 previously made through the layer 203 (damascene-type process). The CMP can be interrupted on the upper side of the layer 203.

As a non-illustrated variant, the conversion elements 201 of the pixels (R) can also be made by a damascene-type process. In this case, before laying the conversion layer 201, a layer 203 is deposited and first openings are made thought the layer 203 in front of the LEDs 176 of the pixels (R) of the device. Then, the layer 201 is deposited and CMP-planarized so that it remains only in the first openings of the layer 203. The openings 205 are then made through the layer 203, then the layer 207 is deposited and CMP-planarized so that it remains only in the openings 205.

FIG. 1O also illustrates a later step of deposition of a passivation layer 209, for example based on the same material as the layer 203, on the upper side of the device.

The resulting device is a three-colour device that comprises first pixels (R) coated with parts of the layer 201, suitable to emit at a first wavelength, for example red light, second pixels (G) coated with parts of the layer 207, suitable to emit at a second wavelength, for example green light, and third pixels (B) coated neither with parts of the layer 201 nor with parts of the layer 207, suitable to emit at a third wavelength corresponding to the emission wavelength of the LEDs 176, for example blue light.

As a non-illustrated variant, it is similarly possible to manufacture a colour display device with a number of emission colours different from three, for example two colours or more than three colours. It should be noted that, in the example above, one of the emission colours of the device is emitted directly by the corresponding LED without photoluminescent conversion by a perovskite material. As a variant, each of the emission colours of the device can be obtained by photoluminescent conversion by a perovskite material. For example, it is possible to get a red-green-blue emission device thanks to ultraviolet LEDs and three perovskite converters of different natures.

In another not-illustrated variant, it is possible to adapt the described process to manufacture a monochromatic display device, wherein each pixel comprises a colour-conversion element based on a perovskite material. This makes it possible, for example, to design a monochromatic device that emits at a different wavelength from the emission wavelength of the LEDs 176. In this case, the conversion elements can be either discretized, like the ones described above, or constitute a continuous layer all over the surface of the display device.

The FIGS. 2A to 2F illustrate successive steps of a variant of the process of manufacturing of a colour picture display device as described in relationship with FIGS. 1J to 1O. In this example, the starting structure is identical or similar to FIG. 1I.

The process of FIGS. 2A to 2F differs from the one of FIGS. 1J to 1O substantially in that, in the example of FIGS. 2A to 2F, for each type of desired photoluminescent conversion element, instead of a non-localized deposition (full plate) of the perovskite material followed by a localized removal of the material in order to retain the material only in front of some LEDs 176 of the device, a localized deposition is made directly in front of some LEDs 176 of the device.

Figure 2A:
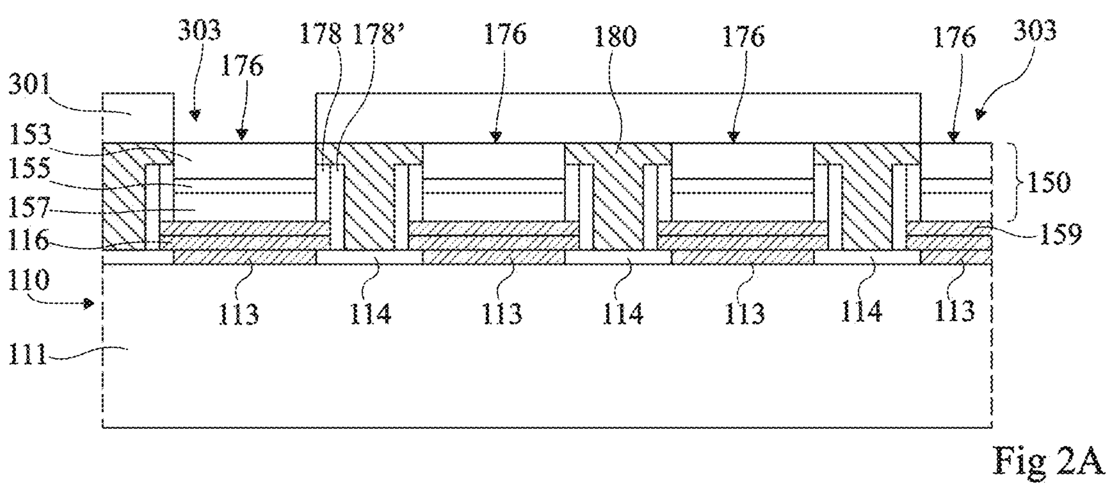
FIGS. 2A to 2F are cross-section views that illustrate successive steps of a variant of a process to manufacture an emissive LED display device according to an embodiment.

FIG. 2A illustrates a step of deposition of a first selective growth mask 301 onto the upper surface of the device of FIG. 1I. The mask layer 301 is initially deposited continuously all over the upper surface of the device. Then, openings 303 are made through the layer 301 in front of some LEDs 176 of the device. The openings 303 cross through all the thickness of the layer 301. The openings 303 reach, for example, the upper side of the semiconductor zone 153 of the LEDs 176.

The mask 301 is based on a material such that, at the following step, the perovskite material does not lay onto the surface of the mask. As an example, the mask 301 is based on a dielectric polymer material, for example parylene. The openings 303 can be made, for example, by photolithography and etching.

Figure 2B:
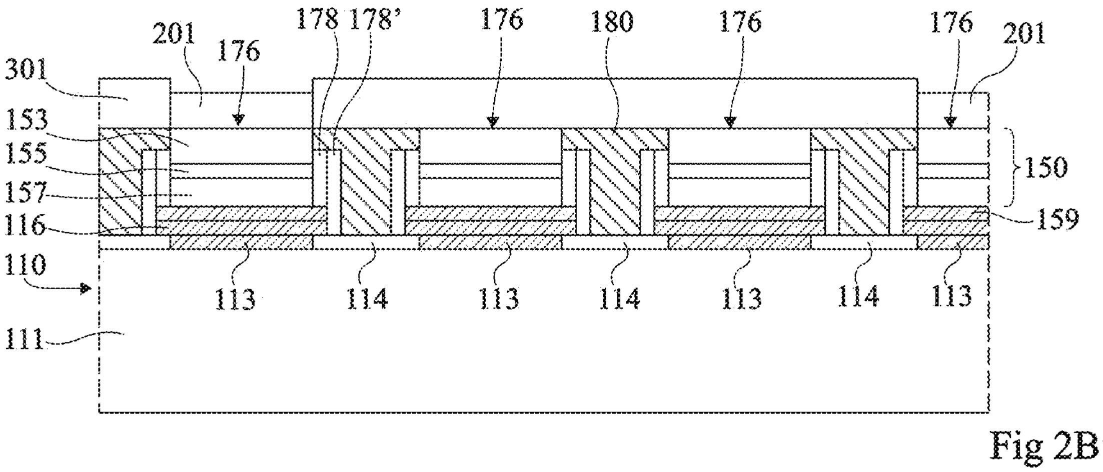

FIG. 2B illustrates a step of localized deposition of a light conversion layer 201 based on a perovskite material onto the upper surface of the display device in front of the openings 303. For example, the layer 201 is suitable to convert blue light into red light. The thickness of the layer 201 is, for example, not more than 1 μm, for example not more than 500 nm, for example not more than 300 nm, for example between 100 and 250 nm. The layer 201 can be monocrystalline, polycrystalline or amorphous. The crystallographic structure of the layer 201 is homogenous all through its thickness. In other words, these are no quantum dots integrated in a matrix layer.

The layer 201 is deposited, for example, by a sol-gel process or by a phase vapor deposition process, for example by PLD deposition. Because of the nature of the material of the mask 301, the layer 201 lays only in the openings 303 and not on the upper side of the mask 301.

In the illustrated example, the conversion layer 201 comes directly in contact, at its lower side, with the upper side of the semiconductor zones 153 of the LEDs 176 located in front of the openings 303. The described embodiments do not restrict to this specific case. The LEDs 176 in front of the openings 303 define first pixels (R) of the device.

Figure 2C:
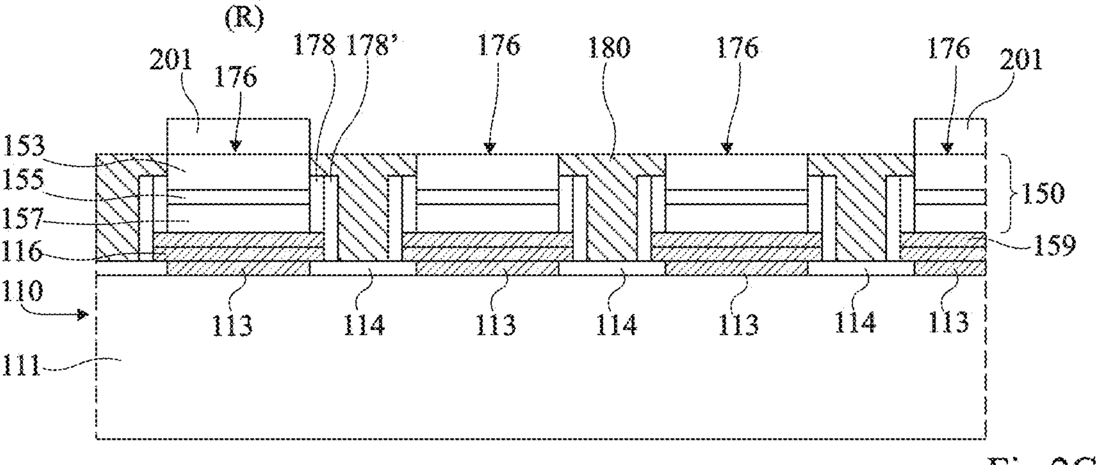

FIG. 2C illustrates a step of removal of the layer 301 in order to retain only parts of the layer 201 in front of the LEDs 176 of the pixels (R) of the device.

Figure 2D:
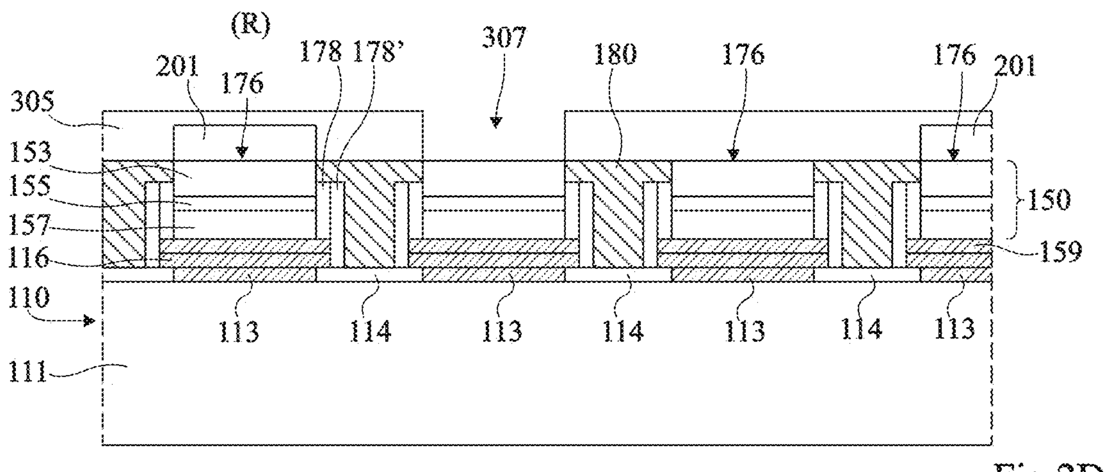

FIG. 2D illustrates a step of deposition of a second selective growth mask 305 onto the upper side of the device of FIG. 2C. The mask layer 305 is initially deposited continuously all over the upper surface of the device. Then, it covers, in particular, parts of layers 201 of the pixels (R) of the device. The openings 307 are then dug through the layer 301 in front of some LEDs 176 not coated by the layer 201. The openings 307 cross through all the thickness of the layer 305. The openings 307 reach, for example, the upper side of the semiconductor zone 153 of the LEDs 176.

The mask 305 is based on a material such that, at the following step, the perovskite material does not lay onto the surface of the mask. The mask 305 is, for example, based on the same material as the mask 301 of the FIGS. 2A and 2B, for example parylene. The openings 307 can be made, for example, by photolithography and etching.

Figure 2E:
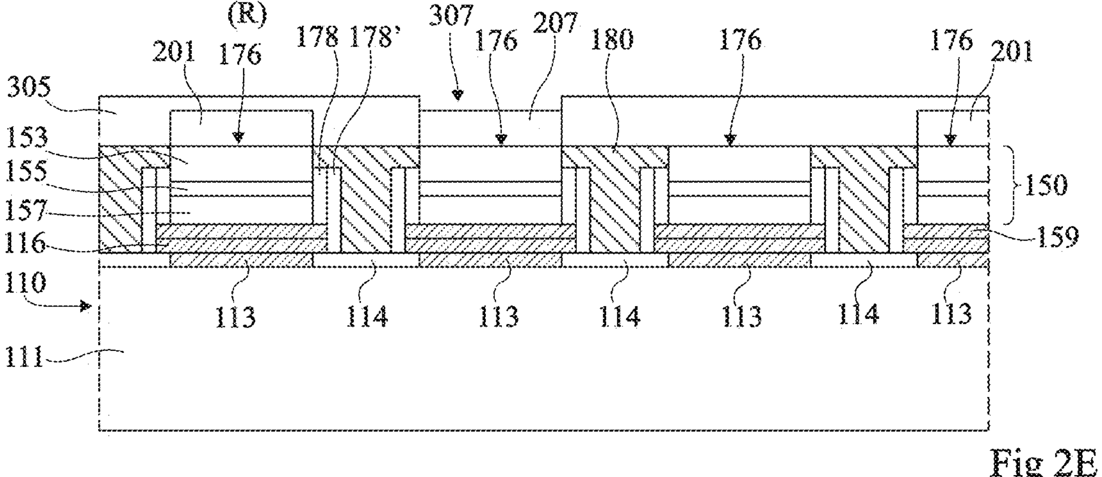

FIG. 2E illustrates a step of localized deposition of a light conversion layer 207 based on a perovskite material onto the upper surface of the display device in front of the openings 303. For example, the layer 207 is suitable to convert blue light into green light. The thickness of the layer 207 is, for example, not more than 1 μm, for example not more than 500 nm, for example not more than 300 nm, for example between 100 and 250 nm. The layer 207 can be monocrystalline, polycrystalline or amorphous. The crystallographic structure of the layer 207 is homogenous all through its thickness. In other words, these are no quantum dots integrated in a matrix layer.

The metal layer 207 is deposited, for example, by a sol-gel process or a phase vapor deposition process, for example by PLD deposition. Because of the nature of the material of the mask 305, the layer 207 lays only in the openings 307 and not on the upper side of the mask 305.

In the illustrated example, the conversion layer 207 comes directly in contact, at its lower side, with the upper side of the semiconductor cathode zones 153 of the LEDs 176 located in front of the openings 307. However, the described embodiments do not restrict to this specific case. The LEDs 176 in front of the openings 307 define second pixels (B) of the device.

Figure 2F:
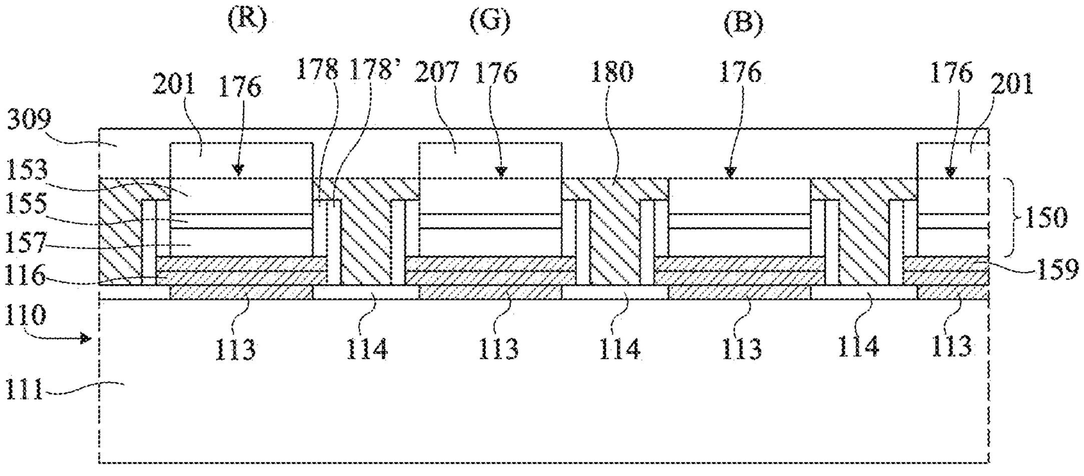

FIG. 2F illustrates a step of removal of the mask 305 in order to retain only parts of the layer 201 in front of the LEDs of the pixels (R) of the device and parts of the layer 207 in front of the LEDs of the pixels (G) of the device.

FIG. 2F further illustrates a step of later deposition of a passivation layer 309 based on a dielectric material, for example silicon oxide or silicon nitride, onto the upper surface of the resulting structure. In this example, the layer 309 extends thicker than the conversion layers 201 and 207. Thus, the parts of the conversion layers 201 and 207 in front of the LEDs of the pixels (R) and (G) of the device remain completely coated by the layer 309. In the pictured example, the layer 309 extends continuously all over the surface of the display device and has a substantially plane upper surface.

The resulting device is a three-colour device that comprises first pixels (R) coated with parts of the layer 201, suitable to emit at a first wavelength, second pixels (G) coated with parts of the layer 207, suitable to emit at a second wavelength, and third pixels (B) coated neither with parts of the layer 201 nor with parts of the layer 207, suitable to emit at a third wavelength corresponding to the emission wavelength of the LEDs 176.

As a non-illustrated variant, it is similarly possible to manufacture a colour display device with a number of emission colours different from three, for example two colours or more than three colours.

In another not-illustrated variant, it is possible to adapt the described process to manufacture a monochromatic display device, wherein each pixel comprises a colour-conversion element based on a perovskite material.

Figure 3:
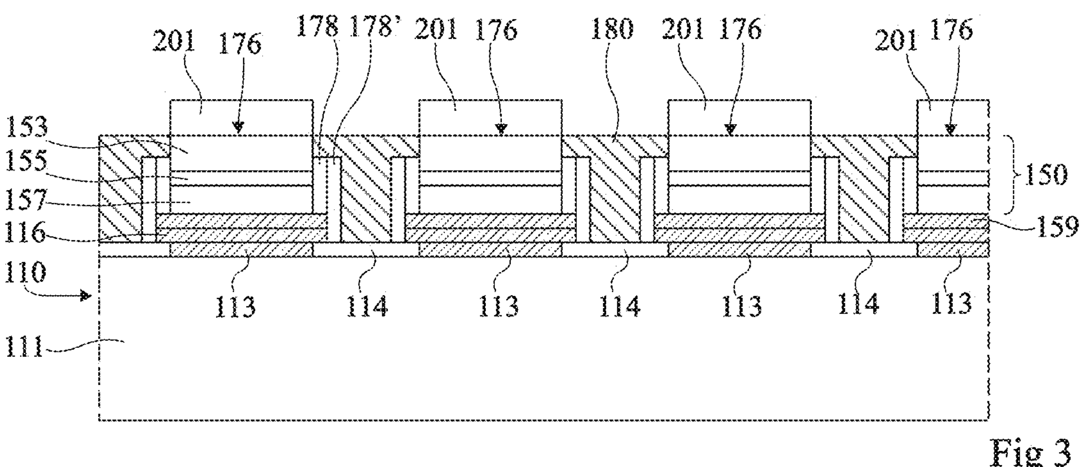
FIG. 3 is a cross-section view that illustrate another variant of a process to manufacture an emissive LED display device according to an embodiment.

FIG. 3 illustrates a cross-section view of another variant of a manufacturing process for a LED-based emissive display device according to an embodiment.

Once again, the initial situation is a monochromatic display device, for example identical to the device of FIG. 1I. In this example, the goal is to design a monochromatic device that emits at a different wavelength from the emission wavelength of the LEDs 176.

To do so, onto each LED 176 is lain a conversion element 201 based on a perovskite material.

According to an embodiment of FIG. 3, the deposition of the conversion elements 201 is a localized, self-aligned deposition onto the upper side of the LEDs 176.

To do so, the deposition is made according to a deposition process suitable to lay the perovskite material onto the upper side of the semiconductor zone 153 of the LEDs 176, for example in contact with the upper side of the zone 153, wherein the perovskite material does not deposit onto the upper side of the metal layers 180 that separate the LEDs 176. To do so, a surface treatment of the metal layers 180 may be provided so that the perovskite material does not deposit onto the metal layers 180. This makes it possible to localize, in a self-aligned way (without a mask), the perovskite material over the LEDs 176. As an example, the perovskite material is deposited by a sol-gel process or a phase vapor deposition process, for example by PLD deposition.

Figure 4A:
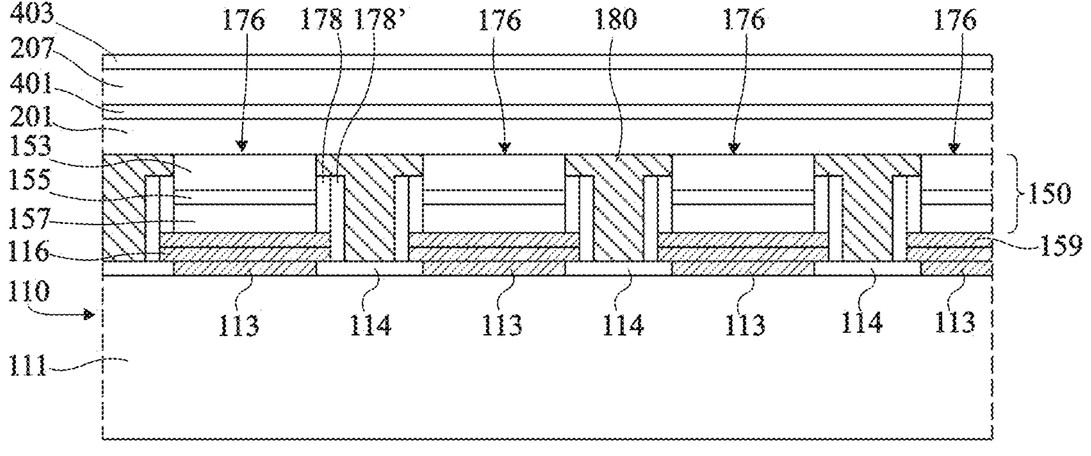
FIGS. 4A to 4C are cross-section views that illustrate successive steps of another variant of a process to manufacture an emissive LED display device according to an embodiment.
Figure 4B:
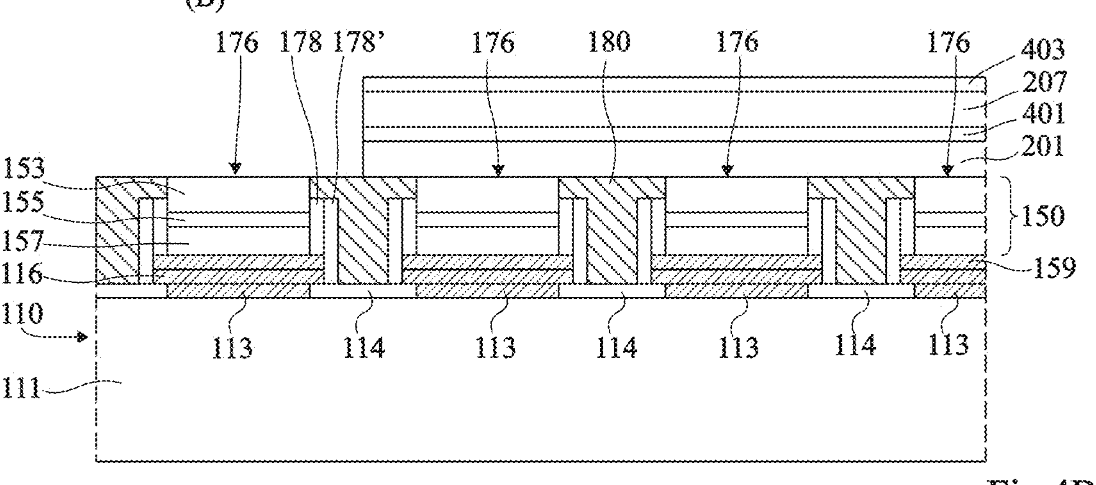
Figure 4C:
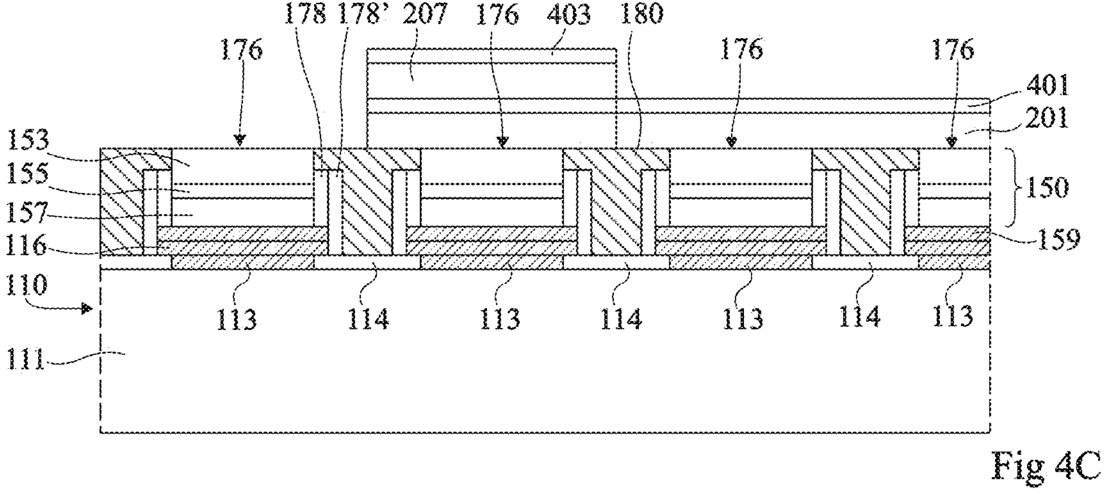

FIGS. 4A to 4C illustrate successive steps of a variant of the process of manufacturing of a colour picture display device as described in relationship with FIGS. 1J to 1O. In this example, the starting structure is once again identical or similar to FIG. 1I.

FIG. 4A illustrates a step of deposition onto the upper side of the device of FIG. 1I, of a pile comprising, up from the upper side of the device of FIG. 1I, a first light-conversion layer 201 based on a first perovskite material, a first etch stop layer 401, a second conversion layer 207 based on a second perovskite material, and a protective coating 403.

The layer 201 is suitable to absorb photons at the emission wavelength of the LEDs 176 and to re-emit photons at another wavelength. As an example, the layer 201 is suitable to convert blue light into green light. The layer 207 is suitable to absorb photons at the emission wavelength of the layer 201 and to re-emit photons at another wavelength that is distinct from the emission wavelength of the LEDs 176. As an example, the layer 207 is suitable to convert green light into red light. The thicknesses of the layers 201 and 207 are, for example, not more than 1 μm, for example not more than 500 nm, for example not more than 300 nm, for example between 100 and 250 nm. The layers 201 and 207 can be monocrystalline, polycrystalline or amorphous. The layers 201 and 207 each have a homogenous crystallographic structure all through their thicknesses. In other words, these are no quantum dots integrated in matrix layers.

The layer 401 is, for example, based on aluminum nitride (AlN) or on any other material, so that the layer 207 can be etched selectively relatively to the layer 401.

The layer 403 can be based on a dielectric material, for example based on silicon oxide.

At this stage, the layers 201, 401, 207 and 403 of the pile extend each continuously all over the upper surface of the device of FIG. 1I.

In the illustrated example, the conversion layer 201 comes directly in contact, at its lower side, with the upper side of the semiconductor zones 153 of the LEDs 176. The described embodiments do not restrict to this specific case.

FIG. 4B illustrates a step of localized etching of the pile of layers 201, 401, 207 and 403 in front of some parts of the display device. In particular, during this stage, the pile of layers 201, 401, 207 and 403 is removed, for example by dry etching, over some LEDs 176, and is retained over other LEDs 176. During this step, an etching mask, not illustrated, for example created by photolithography, can be deposited onto the upper side of the pile, wherein this mask is open in front of parts of the pile to remove. Then, the mask may be removed after etching. The uncoated LEDs 176 after this step define first pixels (B) suitable to emit light at a first wavelength that matches the emission wavelength of the LEDs 176.

FIG. 4C illustrates a step of localized etching of the upper layers 403 and 207 of the pile in front of some parts of the display device.

In particular, during this stage, the layers 403 and 207 are removed, for example by dry etching, over some LEDs 176 that were not uncoated at the previous step, and are retained over the other LEDs 176 that were not uncoated at the previous step. During this step, an etching mask, not illustrated, for example created by photolithography, can be deposited onto the upper side of the pile, wherein this mask is open in front of parts of the pile to remove. Then, the mask may be removed after etching. During this step, the layer 401 is used as an etch stop layer. As a variant, if the perovskite material of the layer 207 can be etched selectively relatively to the perovskite material of the layer 201, the etch stop layer 401 can be omitted. After this step, the LEDs 176 that are coated with the layer 201 and not coated by the layer 207 define second pixels (G) suitable to emit at a second wavelength different from the emission wavelength of the LEDs 176, and the LEDs 176 that are coated by the layer 201 and by the layer 207 define third pixels (R) suitable to emit light at a third wavelength different from the emission wavelengths of the first (B) and second (G) pixels.

After this step, a passivation layer, not illustrated, may be deposited onto the upper side of the device.

As a non-illustrated variant, it is similarly possible to manufacture a colour display device with a number of emission colours higher than three.

FIGS. 5A to 5F illustrate successive steps of another variant of the process of manufacturing of the colour picture display device as described in relationship with FIGS. 1J to 1O. In this example, the starting structure is once again identical or similar to FIG. 1I.

In this variant, a lift-off process is used to create the conversion elements 201 and 207 without an etching step of the perovskite materials.

FIG. 5A illustrates a step of deposition of a first sacrificial layer 501 onto the upper side of the device of FIG. 1I. The mask layer 501 is initially continuously deposited over the whole upper surface of the device, then openings 503 are drilled through the layer 501 in front of some LEDs 176 of the device. The openings 503 cross through all the thickness of the layer 301. The openings 503 reach, for example, the upper side of the semiconductor zone 153 of the LEDs 176.

The mask 501 is based on a material that can be selectively etched relatively to the perovskite material of the conversion layer 201 of the following step. As an example, the mask 501 is based on a resin or on silicon oxide. The openings 501 can be made, for example, by photolithography and etching.

FIG. 5B illustrates a step of deposition of a light conversion layer 201 based on a perovskite material onto the upper surface of the device. The layer 201 extends over the upper side of the mask layer 501 and on the supper side of the LEDs 176 in the openings 503. For example, the layer 201 is suitable to convert blue light into red light. The thickness of the layer 201 is, for example, not more than 1 μm, for example not more than 500 nm, for example not more than 300 nm, for example between 100 and 250 nm. The layer 201 can be monocrystalline, polycrystalline or amorphous. The crystallographic structure of the layer 201 is homogenous all through its thickness. In other words, these are no quantum dots integrated in a matrix layer. The layer 201 is deposited, for example, by a sol-gel process or by a phase vapor deposition process, for example by a PLD deposition process. In the illustrated example, the conversion layer 201 comes directly in contact, at its lower side, with the upper side of the semiconductor zones 153 of the LEDs 176 located in front of the openings 503. The described embodiments do not restrict to this specific case. The LEDs 176 in front of the openings 503 define first pixels (R) of the device.

FIG. 5C illustrates a step of removal of the sacrificial layer 501, for example by dry etching. This leads to the lift-off removal of the part of the layer 201 on the upper side of the mask 501. Thus, after this step, only remain the parts of the conversion layer 201 in front of the openings 503 previously made through the layer 501 in front of the LEDs 176 of the pixels (R) of the device.

Figure 5D:
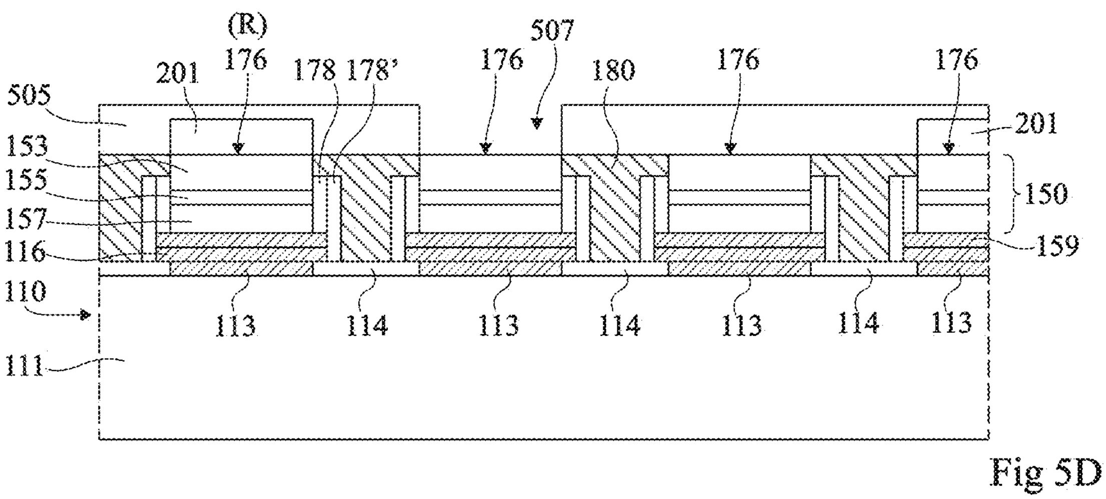

FIG. 5D illustrates a structure resulting from a manufacturing step of a second sacrificial mask 505 on the upper side of the structure of FIG. 5C. The mask layer 505 is initially continuously deposited over the whole upper surface of the device. In particular, the mask layer 505 totally covers the parts of layers 201 of the pixels (R) of the device. The openings 507 are then dug through the layer 505 in front of some LEDs 176 not coated by the portions of the layer 201. The openings 507 cross through all the thickness of the layer 505. The openings 505 reach, for example, the upper side of the zone 153 of the LEDs 176.

The mask 505 is based on a material that can be selectively etched relatively to the perovskite material of the conversion layer 207 of the following step. As an example, the mask 505 is based on a resin or on silicon oxide. The mask 505 is, for example, based on the same material as the mask 501 that was removed at the previous step. The openings 507 can be made, for example, by photolithography and etching.

Figure 5E:
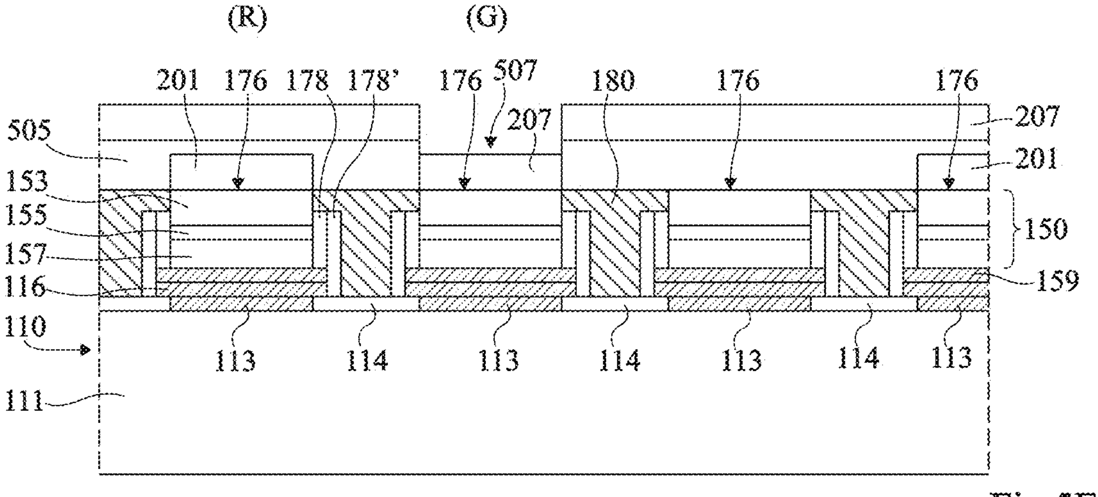

FIG. 5E illustrates a step of deposition of a light conversion layer 207 based on a perovskite material onto the upper surface of the device. The layer 207 extends over the upper side of the mask layer 505 and on the supper side of the LEDs 176 in the openings 507. For example, the layer 207 is suitable to convert blue light into green light. The thickness of the layer 207 is, for example, not more than 1 μm, for example not more than 500 nm, for example not more than 300 nm, for example between 100 and 250 nm. The layer 207 can be monocrystalline, polycrystalline or amorphous. The crystallographic structure of the layer 207 is homogenous all through its thickness. In other words, these are no quantum dots integrated in a matrix layer. The layer 207 is deposited, for example, by a sol-gel process or by a phase vapor deposition process, for example by a PLD deposition process. In the illustrated example, the conversion layer 207 comes directly in contact, at its lower side, with the upper side of the semiconductor zones 153 of the LEDs 176 located in front of the openings 507. The described embodiments do not restrict to this specific case. The LEDs 176 in front of the openings 507 define second pixels (G) of the device.

Figure 5F:
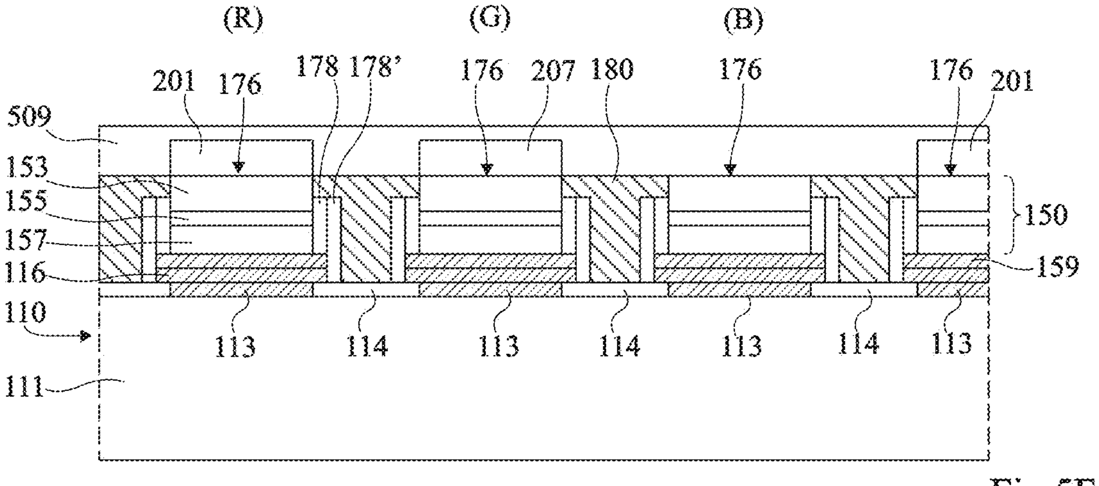

FIG. 5F illustrates a step of removal of the sacrificial layer 505, for example by dry etching. This leads to the lift-off removal of the part of the layer 207 on the upper side of the mask 505. Thus, after this step, only remain the parts of the conversion layer 201 in front of the LEDs 176 of the pixels (R) of the device, and the parts of the conversion layer 207 in front of the LEDs 176 of the pixels (G) of the device.

FIG. 5F further illustrates a step of later deposition of a passivation layer 509 based on a dielectric material, for example silicon oxide or silicon nitride, onto the upper surface of the resulting structure. In this example, the layer 509 extends thicker than the conversion layers 201 and 207. Thus, the parts of the conversion layers 201 and 207 in front of the LEDs of the pixels (R) and (G) of the device remain completely coated by the layer 509. In the pictured example, the layer 509 extends continuously all over the surface of the display device and has a substantially plane upper surface. As a non-illustrated variant, the part of the layer 509 in front of the pixels B can be locally etched all through its thickness and replaced by another material with a refraction index intermediate between the one of layer 509 and of the semiconductor material of layer 153, in order to prevent or limit a phenomenon of lateral deviation of the light emitted by the pixels B within the layer 159.

The resulting device is a three-colour device that comprises first pixels (R) coated with parts of the layer 201, suitable to emit at a first wavelength, second pixels (G) coated with parts of the layer 207, suitable to emit at a second wavelength, and third pixels (B) coated neither with parts of the layer 201 nor with parts of the layer 207, suitable to emit at a third wavelength corresponding to the emission wavelength of the LEDs 176.

As a non-illustrated variant, it is similarly possible to manufacture a colour display device with a number of emission colours different from three, for example two colours or more than three colours.

In another not-illustrated variant, it is possible to adapt the described process to manufacture a monochromatic display device, wherein each pixel comprises a colour-conversion element based on a perovskite material.

Various embodiments and variants have been described. Those skilled in the art will understand that certain features of these embodiments can be combined and other variants will readily occur to those skilled in the art. In particular, the types of conductivity of the semiconductor layers 153 (N-type in the described examples) and 157 (P-type in the described examples) can be reversed.

Furthermore, although are described only examples of gallium-nitride-LED-based display devices, the described embodiments can be adapted to the manufacture of any LED-based emissive device, including based in inorganic semiconductor materials other than gallium nitride, for example with LEDs based on other III-V semiconductor materials. As a variant, the described embodiments can be adapted to the manufacture of organic LED-based emissive devices.

Moreover, although it is not detailed above, the light conversion elements based on perovskite materials 201 and/or 207 can be combined with colour filters, for example to improve the colour saturation. As an example, in the devices described above, the conversion elements 201 and/or 207 of the pixels (R) and (G) can be covered with a filter, for example a coloured resin, adapted to let pass light at the emission wavelength of the corresponding conversion element 201 and/or 207 and to block the light at the emission wavelength of the LEDs 176. This makes it possible to remove possible remnants of the radiations from the LEDs 176 that could pass through the elements 201 and 207.

In addition, the described embodiments do not restrict to the specific example of manufacturing process of the initial monochromatic display device in relationship with the FIGS. 1A to 1I. As a variant, the initial monochromatic display device can be manufactured with a process such as the one described in the previous application WO2017/194845 by the applicant, or by a process comprising a hybridization of a control integrated circuit and an already pixelized array of LEDs, for example such as in the previous application WO2019/180362 by the applicant.

Furthermore, although hereabove are described examples of integration of conversion elements based on perovskite materials in a monolithic LED display device (microscreen), wherein the described embodiments do not restrict to this specific application. As a variant, it is possible to use a perovskite-based conversion layer on an elementary chip of the LED-based lighting device or on an elementary chip comprising at least one LED and, facultatively, a control circuit of said at least one LED that defines a pixel of a LED-based display device, for example of the type described in the previous applications WO2017/089676, WO2018/185434 or WO2018/185433 by the applicant. More generally, the described embodiments can be adapted to any application needing the conversion of light emitted by a LED.

Furthermore, although there are described above examples of integration of conversion elements based on perovskite materials in a planar LED-based display device, the embodiments can be adapted to suit tridimensional LED-based display devices, for example for nanowire-based LEDs or semiconductor microwire-based LEDs, or pyramid-shaped LEDs (micropyramids or nanopyramids), for example such as described in the previous applications FR3087942 or FR3089687 by the applicant. In this case, the perovskite conversion layer can be either directly deposited onto the LEDs, or onto an intermediate planarization coating over the LEDs.

In addition, the described embodiments are not limited to the specific examples described above of deposition processes for perovskite materials. More generally, the perovskite conversion layers can be deposited by any suitable deposition process, for example by PLD deposition, by a physical vapor deposition process (PVD), by a sol-gel deposition, by a chemical vapor deposition process (CVD), or by an hybrid deposition process (for example metal deposition and bath of organic solution, for example based on $CH_3NH_3$).

The invention claimed is:

1. An optoelectronic device comprising an array of pixels, wherein each pixel comprises a light-emitting diode, wherein the array of pixels comprises at least first pixels where the light-emitting diode is covered with a first photoluminescent conversion layer based on a first inorganic perovskite material, wherein the first photoluminescent conversion layer is less than 500 nm thick, wherein the array of pixels comprises at least second pixels, wherein the light-emitting diode is covered with a second photoluminescent conversion layer based on a second inorganic perovskite material distinct from the first inorganic perovskite material, and third pixels, wherein the light-emitting diode is not covered by the first and second photoluminescent conversion layers, and wherein the light-emitting diodes of the first pixels are not covered by the second photoluminescent conversion layer et wherein the light-emitting diodes of the second pixels are covered by the first photoluminescent conversion layer and by the second photoluminescent conversion layer.

2. A device according to claim 1, wherein the pixel pitch of the array of pixels is not more than 5 μm.

3. A device according to claim 1 wherein, in each first pixel, the first photoluminescent conversion layer is based on an inorganic perovskite halogen material.

4. A device according to claim 1 wherein, in each pixel, the light-emitting diode is an inorganic light-emitting diode.

5. A device according to claim 1 wherein, in each first pixel, the first photoluminescent conversion layer is in contact with a semiconductor zone of the light-emitting diode.

6. A device according to claim 5, wherein said semiconductor zone is based on a semiconductor III-V material, preferably based on gallium nitride.

7. A device according to claim 1, wherein the first, second and third pixels are integrated in a same monolithic display device.

8. A device according to claim 1 further comprising, adjoined to the array of pixels, an integrated circuit to monitor the light-emitting diodes of the pixels.

9. A device according to claim 8, wherein the monitoring integrated circuit is a CMOS circuit.

10. A process according to claim 9, wherein said first photoluminescent conversion layer is deposited onto and in contact with a semiconductor zone of the light-emitting diode.

11. A process to manufacture the optoelectronic device according to claim 1, the process comprising a deposition step by a physical vapor deposition process of the first photoluminescent conversion layer into a first inorganic perovskite material.

12. A process according to claim 11, wherein said first photoluminescent conversion layer is less than 500 nm thick.

13. A process according to claim 11, wherein said first photoluminescent conversion layer is deposited by pulsed laser deposition.

14. A process according to claim 11, wherein the first photoluminescent conversion layer is deposited through a selective growth substrate.

15. A process according to claim 11, wherein the first photoluminescent conversion layer is locally deposited and self-aligned by selective growth on the light-emitting diode of each pixel.

16. A process according to claim 11, wherein said first photoluminescent conversion layer is continuously deposited onto the whole surface of the device.

17. A process according to claim 16, wherein the first photoluminescent conversion layer is first continuously deposited onto the whole surface of the device, and then locally removed by photolithography and etching.

18. A process according to claim 16, wherein the first photoluminescent conversion layer is deposited onto and through a sacrificial mask, wherein the process further comprises, after deposition of the first photoluminescent conversion layer, a step of removing the sacrificial mask.

* * * * *